United States Patent
Itoh et al.

(10) Patent No.: US 8,282,859 B2
(45) Date of Patent: Oct. 9, 2012

(54) GREEN EMITTING PHOSPHOR

(75) Inventors: Jun-ichi Itoh, Ageo (JP); Asuka Sasakura, Ageo (JP); Taizou Morinaka, Hida (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 13/057,381

(22) PCT Filed: May 8, 2009

(86) PCT No.: PCT/JP2009/002016
§ 371 (c)(1),
(2), (4) Date: Jun. 15, 2011

(87) PCT Pub. No.: WO2009/136505
PCT Pub. Date: Nov. 12, 2009

(65) Prior Publication Data
US 2011/0253940 A1    Oct. 20, 2011

(30) Foreign Application Priority Data
May 9, 2008    (JP) .................................. 2008-123894

(51) Int. Cl.
*C09K 11/08*    (2006.01)
*H01J 1/62*    (2006.01)

(52) U.S. Cl. .................................. 252/301.4 S; 313/503

(58) Field of Classification Search ............ 252/301.4 S, 252/301.4 R; 313/486, 498, 503
See application file for complete search history.

(56) References Cited

U.S. PATENT DOCUMENTS

| | | | |
|---|---|---|---|
| 6,544,438 B2 | 4/2003 | Yocom et al. | |
| 6,686,691 B1 | 2/2004 | Mueller et al. | |
| 7,832,312 B2 | 11/2010 | Yoon et al. | |
| 2002/0014614 A1 | 2/2002 | Yocom et al. | |
| 2004/0263074 A1* | 12/2004 | Baroky et al. | 313/512 |
| 2009/0041984 A1* | 2/2009 | Mayers et al. | 428/141 |
| 2009/0134775 A1* | 5/2009 | Watanabe et al. | 313/503 |
| 2009/0140630 A1 | 6/2009 | Kijima et al. | |

FOREIGN PATENT DOCUMENTS

| | | |
|---|---|---|
| EP | 1865564 A1 | 12/2007 |
| JP | 2002060747 A | 2/2002 |
| JP | 2004505167 A | 2/2004 |
| JP | 2007056267 A | 3/2007 |
| JP | 2007131794 A | 5/2007 |
| JP | 2007214579 A | 8/2007 |
| JP | 2007277277 A | 10/2007 |
| JP | 2007314626 A | 12/2007 |
| WO | 0210312 A1 | 2/2002 |
| WO | 2006098450 A1 | 9/2006 |

* cited by examiner

*Primary Examiner* — Emily Le
*Assistant Examiner* — Lynne Edmondson
(74) *Attorney, Agent, or Firm* — The Webb Law Firm

(57) ABSTRACT

A green emitting phosphor exhibiting an excellent absorption ratio is provided. A green emitting phosphor containing a crystal represented by $MGa_2S_4:Eu^{2+}$, wherein M is an element comprising one species or a combination of two or more species among Sr, Ba and Ca, and $Eu^{2+}$ is a luminescent center, and wherein the particle diameter at 10%, D10, 4.5 μm to 30 μm in the volume-based particle size distribution measured and obtained by the laser diffraction/diffusion particle size distribution measurement method.

20 Claims, 2 Drawing Sheets

GREEN EMITTING PHOSPHOR

TECHNICAL FIELD

The present invention relates to a green emitting phosphor. Specifically, it relates to a green emitting phosphor that can be excited with a blue LED or a near-ultraviolet LED and can be used as a phosphor for lighting or be used as a phosphor for backlights for liquid crystal or a display phosphor such as for FED (Field Emission Display), PDP (plasma display) and EL (electroluminescence).

TECHNICAL BACKGROUND

Although the mainstream light sources for lighting currently are fluorescent lights and incandescent light bulbs, those using LEDs (luminescent diodes) as the light source, compared to fluorescent lights or the like, have less consumption power, longer life span, excellent safety aspects such as not being hot to the touch, and moreover, excellent environmental aspects as they do not contain toxic substances such as mercury, and thus, are anticipated to become the mainstream light sources for lighting in the near future.

White LEDs currently in use are constituted by combining a blue LED and YAG:Ce (yellow emitting phosphor), and bear the problem that they have poor color rendering properties to demonstrate natural color generation ability, such that, particularly when a red-colored object or a person's skin is illuminated with such white LEDs currently in use, colors illuminated by natural light cannot be reproduced. Thus, as a method for improving the color rendering properties of such white LEDs currently in use, constituting a white LED by combining a near-ultraviolet LED and 3 species of emitting phosphors, red, green and blue, or by combining a blue LED and two species of emitting phosphors, red and green, has been examined, and $SrGa_2S_4$:Eu has been described as a green emitting phosphor to be used for such purposes (refer to Patent References 1, 2 and 3).

[Patent Reference 1] Japanese Patent Application Laid-open No. 2002-060747

[Patent Reference 2] Japanese Patent Application Laid-open No. 2007-056267

[Patent Reference 3] Japanese Patent Application Laid-open No. 2007-214579

In prior art, green emitting phosphors comprising the described $SrGa_2S_4$:Eu, needed to increase luminescent efficiency further. Using an emitting phosphor with a high external quantum efficiency (=internal quantum efficiency×absorption ratio) is important to increase luminescent efficiency. Thus, the present invention focuses on the absorption ratio, which is one of the factors swaying external quantum efficiency, and provides a green emitting phosphor demonstrating excellent absorption ratio so as to increase the luminescent efficiency.

SUMMARY OF THE INVENTION

The present invention proposes a green emitting phosphor, which is a green emitting phosphor containing a luminescent center and a host material containing Ga, S and an element comprising one species or a combination of two or more species among Sr, Ba and Ca, and characterized by the particle diameter at 10% (D10) cumulative percent passing (also called "cumulative passing rate") from the small particle-size side being 4.5 μm to 30 μm in the volume-based particle size distribution measured and obtained by the laser diffraction/diffusion particle size distribution measurement method.

According to the green emitting phosphor of the present invention, a green emitting phosphor can be provided, emitting a green light by way of an excitation light with a wavelength in the near-ultraviolet region to blue region (on the order of 300 nm to 510 nm), and furthermore, displaying an excellent absorption ratio and allowing a high external quantum efficiency to be realized.

Studies by the present inventors found that, in a green emitting phosphor containing a luminescent center and a host material containing Ga, S and an element comprising one species or a combination of two or more species among Sr, Ba and Ca, the absorption ratio thereof had a low correlation with D50, which indicates the median diameter, or the average particle size, while the correlation with D10 was extremely high. Thus, based on such novel observations, the present invention proposes a green emitting phosphor with a high absorption ratio by prescribing the D10 of the green emitting phosphor.

DETAILED DESCRIPTION OF THE INVENTION

Figure 1:
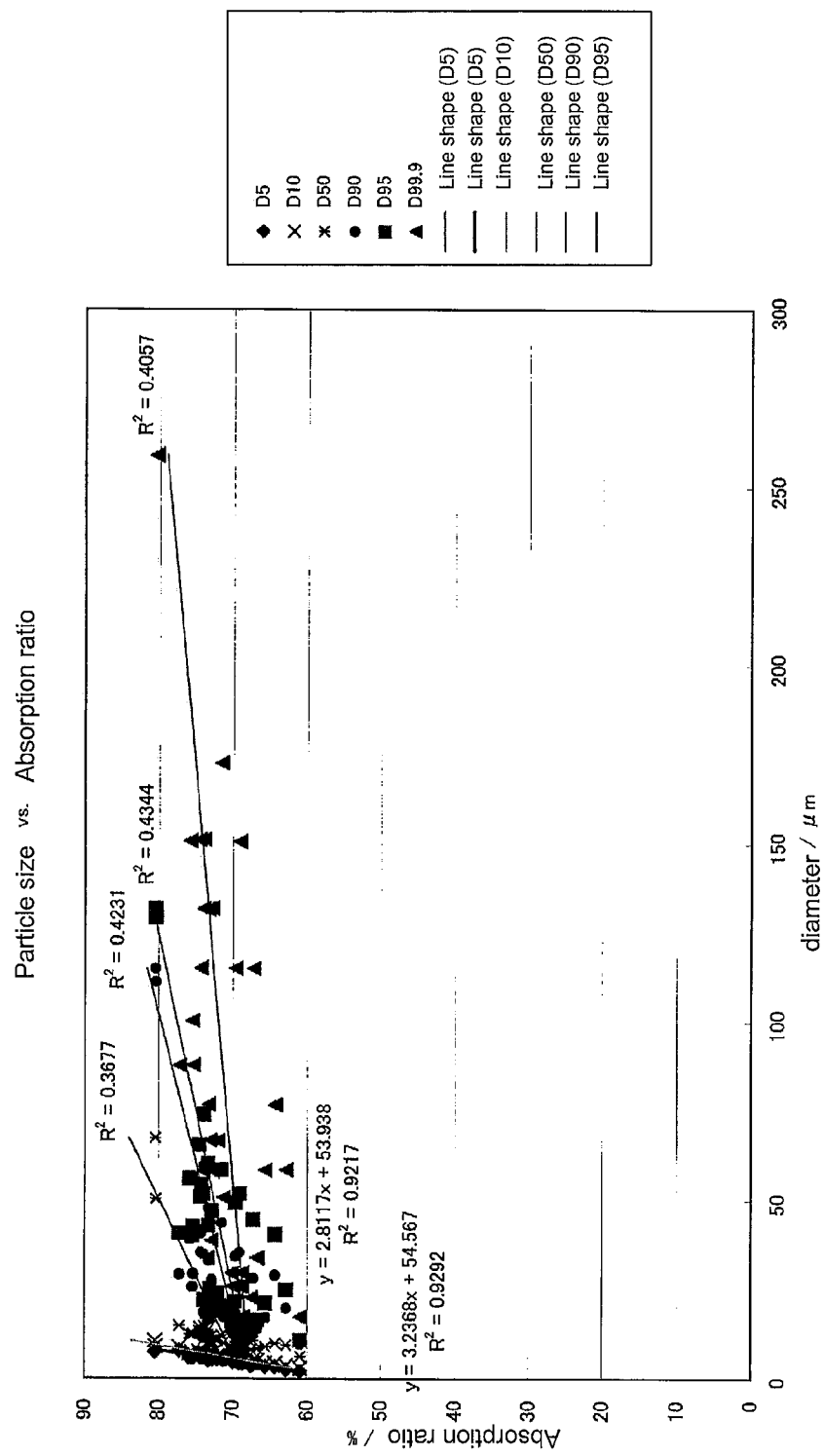
FIG. 1 is a graph showing the relationship between particle size (μm) and absorption ratio (%) for the samples (N=41), by class of particle diameter such as D5, D10, D50, and D90.

Hereafter, embodiments of the present invention will be described in detail; however, the scope of the present invention is not to be limited to the embodiments described below.

The green emitting phosphor according to the present embodiment (hereinafter referred to as "the present green emitting phosphor") is a green emitting phosphor comprising a host material, which contains Ga, S and an element comprising one species or a combination of two or more species among Sr, Ba and Ca, and which has been doped with $Eu^{2+}$ as a luminescent center.

In terms of general formula, the present green emitting phosphor is a phosphor containing a crystal represented by $MGa_2S_4:Eu^{2+}$ (where M is an element comprising one species or a combination of two or more species among Sr, Ba and Ca).

However, as proportions in mass of the constitutive elements in the present green emitting phosphor, 13 to 34 percent in mass of the entirety, preferably 15 to 30 percent in mass and particularly preferably 17 to 28 percent in mass, is allowed for M, and 34 to 46 percent in mass of the entirety, preferably 37 to 43 percent in mass and particularly preferably 38 to 42 percent in mass, is allowed for Ga.

It is desirable that the luminescent center (luminescent ion) of the present green emitting phosphor is one containing divalent $Eu^{2+}$, and, in particular, a divalent $Eu^{2+}$ alone. Although it is known that the light emission wavelengths (colors) of $Eu^{2+}$ strongly depend on the host material, demonstrating various wavelengths depending on the host material, a host material specified by the present green emitting phosphor allows an emission spectrum demonstrating green color to be obtained.

The concentration in $Eu^{2+}$ is preferably 0.1 to 10 mol % of the concentration in Sr in the host material, of which 0.5 to 7 mol % and particularly 1 to 5 mol % form among this are desirable.

Note that similar effects can be anticipated using as the luminescent center (luminescent ion) ions other than $Eu^{2+}$, for instance, one species or two or more species of ions chosen from the group comprising rare earth ions and transition metal ions. As rare earth ions, for instance, ions such as Sc, Tb and Er may be cited, and as transition metal ions, for instance, ions such as Mn, Cu, Ag, Cr and Ti may be cited.

(Particle Size Distribution)

For the present green emitting phosphor it is important that, in the volume-based particle size distribution measured and obtained by laser diffraction/diffusion particle size distribution measurement method, the particle diameter at 10% cumulative percent passing (D10) from the small particle-size side is 4.5 µm to 30 µm, and 5 µm to 30 µm, in particular 7 µm to 30 µm, is desirable.

In a green emitting phosphor having the composition of the present green emitting phosphor, there is a particularly high correlation between D10 and the absorption ratio, and limiting D10 to be 4.5 µm or larger allows the absorption ratio of the phosphor particle (the efficiency of the phosphor to absorb light from a light source) to be 65% or greater, and limiting to 5 µm or larger allows the absorption ratio of the phosphor particle to be 70% or greater, which allows the external quantum efficiency (efficiency of extracting light) of the phosphor particle to be raised. However, if D10 exceeds 30 µm, the absorption ratio decreases, and depending on the application, the phosphor is dispersed in a resin to be used, thus, in such cases, there is the possibility that the filling ratio per unit volume decreases, which is not desirable. in addition, when a low-viscosity resin is used dispersability worsens, and there is a possibility that sufficiently bringing out the capabilities of luminescent device such as white LEDs becomes difficult. Thus, it is desirable that the upper limit value of D10 is 30 µm or smaller.

In addition, regarding the particle diameter at 5% cumulative percent passing (D5) from the small particle-size side in the volume-based particle size distribution measured and obtained by the laser diffraction/diffusion particle size distribution measurement method, 3.5 µm to 20 µm is desirable, in particular 4.5 µm to 20 µm, and of this, in particular 5 µm to 20 µm is desirable.

In a green emitting phosphor having the composition of the present green emitting phosphor, since there is also a high correlation between D5 and the absorption ratio, limiting D5 to be 3.5 µm or larger allows the absorption ratio of the phosphor particle to be 65% or greater more certainly, limiting to be 4.5 µm or larger allows the absorption ratio of the phosphor particle to be70% or greater more certainly, which allows the external quantum efficiency of the phosphor particle to be raised even further.

Meanwhile, it is desirable that the upper limit of D5 is 20 µm or smaller, for similar reasons to D10.

In addition, it is desirable that, in the volume-based particle size distribution measured and obtained by laser diffraction/diffusion particle size distribution measurement method, the particle diameter at 90% cumulative percent passing (D90) from the small particle-size side is 7.5 µm or larger, in particular 13 µm or larger, and among this, in particular 22 µm or larger is desirable.

On the other hand, since those with particle sizes larger than 150 µm and in particular those with particle sizes larger than 190 µm have been revealed to lower the absorption ratio, it is desirable that D90 is 190 µm or smaller (in particular less than 190 µm), of which 100 µm or smaller (in particular less than 100 µm), and among which in particular 50 µm or smaller (in particular less than 50 µm) is particularly desirable.

In addition, it is desirable that, in the volume-based particle size distribution measured and obtained by the laser diffraction/diffusion particle size distribution measurement method, the particle diameter at 50% cumulative percent passing (D50) from the small particle-size side is 7 µm to 50 µm, in particular 8 µm to 50 µm, and among this, in particular 12 µm to 45 µm is desirable.

Then, in this circumstance, it is desirable that the ratio (p10/p50) of the frequency at 10% cumulative percent passing (%, noted p10) from the small particle-size side with respect to the frequency at 50% cumulative percent passing (%, noted p50) from the small particle-size side is 0.20 to 0.65, in particular 0.20 to 0.60, of which in particular 0.20 to 0.55 is desirable.

Here, "frequency" means the frequency (%) of the particle size for the corresponding ch when the 0.1 µm to 1000 µm range is divided into 128 ch.

(Specific Surface Area)

It is desirable that the specific surface area of the present green emitting phosphor is 0.20 to 1.2 $m^2/g$, in particular 0.22 to 0.90 $m^2/g$, of which in particular 0.25 to 0.60 $m^2/g$ is desirable.

(Characteristics of the Present Green Emitting Phosphor)

Figure 2:
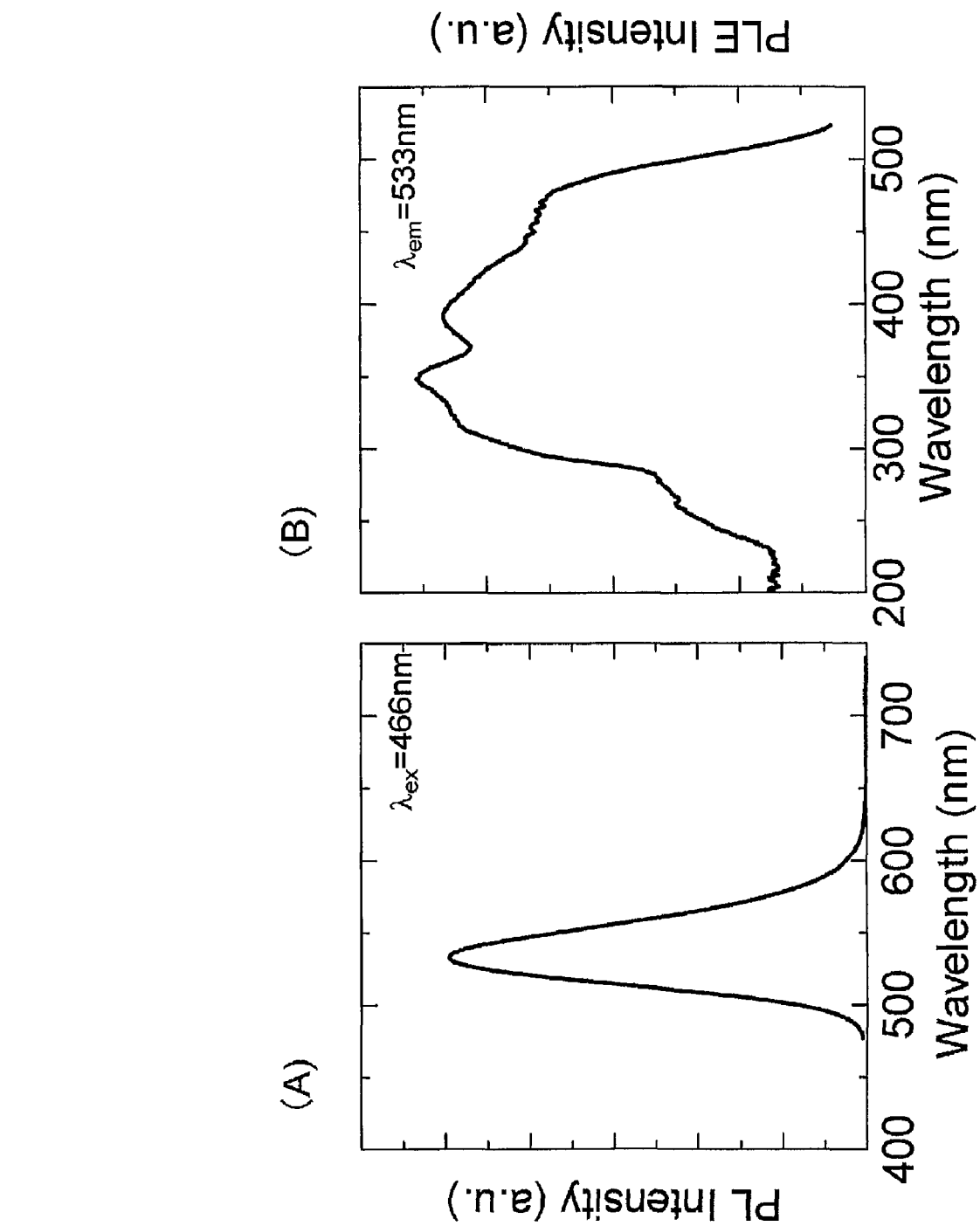
FIG. 2(A) is the emission spectrum phosphor obtained in Example 2-1 and FIG. 2(B) is the excitation spectrum thereof.

The present green emitting phosphor is excited by light with a wavelength of the near-ultraviolet region to the blue region (on the order of 300 nm to 510 nm) and emits green light (refer to FIGS. 2 (A) and (B)).

Regarding the emission spectrum of the present green emitting phosphor, it has the characteristic of having a light emission peak in the region of 502 nm±30 nm to 557 nm±30 nm wavelength, due to light excitation on the order of 300 nm to 510 nm wavelength, and the green color tone can be adjusted in the range of 502 nm±30 nm to 557 nm±30 nm wavelength by altering the proportions of Sr, Ba and Ca.

Incidentally, the light emission peak of $BaGa_2S_4$:Eu is at 502 nm±30 nm, light emission peak of $SrGa_2S_4$:Eu is at 536 nm±30 nm and the light emission peak of $CaGa_2S_4$:Eu is at 557 nm±30 nm.

Note that the present green emitting phosphor has one characteristic on the point that the width and position of the emission spectrum do not change when excited at any wavelength from the near-ultraviolet region to the blue region wavelength (on the order of 300 nm to 510 nm) if the composition is the same.

Regarding CIE color coordinates, the present green emitting phosphor can emit green light represented by x=0.05 to 0.40 and y=0.50 to 0.80, in particular green light represented by x=0.15 to 0.35 and y=0.60 to 0.75, and among this, green light represented by x=0.25 to 0.33 and y=0.65 to 0.73, and the green color tone can be adjusted by altering the proportions of Sr, Ba and Ca.

Incidentally, the CIE color coordinates of $BaGa_2S_4$:Eu are (0.13, 0.49), the CIE color coordinates of $SrGa_2S_4$:Eu are (0.30, 0.67) and the CIE color coordinates of $BaGa_2S_4$:Eu are (0.39, 0.60).

The absorption ratio of the present green emitting phosphor can be set to 65% or greater, and can be adjusted further to 70% or greater, and, furthermore, to 75% or greater, by controlling the particle size distribution as described above.

As a result of the ability to raise the absorption ratio in this way, the external quantum efficiency of the present green emitting phosphor can be set to 30% or greater, and can be adjusted further to 35% or greater, and, furthermore, to 40% or greater, by controlling the particle size distribution as described above.

(Fabrication Method)

Hereafter, one example of preferred fabrication method for the present green emitting phosphor will be described. However, there is no limitation to the fabrication method described below.

The present green emitting phosphor can be obtained by respectively weighing and mixing raw materials such as any of Sr raw materials, Ba raw materials and Ca raw materials or two or more species of these, and, Ga raw materials, S raw materials, as well as Eu raw materials, firing in a reducing atmosphere at 900 to 1400° C., crushing with a stamp mill, an automatic mortar grinder or the like, then, sorting with a sieve or the like, preferably further precipitating with a non-aqueous organic solvent, ethanol to begin with, or water, removing the supernatant and drying.

As the Sr raw materials, Ba raw materials and Ca raw materials described above, in addition to oxides of each element, salts such as complex oxides and carbonates can be cited.

As Ga raw materials, gallium salts such as $Ga_2O_3$ and $Ga_2S_3$ can be cited.

As S raw materials, $Ga_2S_3$, EuS, S, BaS, $SiS_2$, $Ce_2S_3$, $H_2S$ gas and the like can be cited in addition to SrS.

As Eu raw materials, europium compounds (Eu salts) such as EuS, $EuF_3$, $Eu_2O_3$ and $EuCl_3$ can be cited.

In order to improve color rendering properties, rare earth elements such as Pr and Sm may be added to the raw materials as color adjusters.

In order to increase the excitation efficiency, one or more species of elements selected from the elements of the rare earth family, such as Sc, La, Gd and Lu, may be added as sensitizers.

However, it is desirable that the amounts thereof added are respectively 5 mol % or less with respect to Sr. If the contents in these elements exceed 5 mol %, there is the danger that large amounts of phases will deposit, notably decreasing the brightness.

In addition, alkaline metal elements, monovalent cationic metals such as $Ag^+$ and halogen ions such as $Cl^-$, $F^-$ and $I^-$ may be added to the raw materials as charge compensators. From the points of charge compensation effect and brightness, it is desirable that the amounts thereof added are to the same extents as the aluminum family and rare earth family contents.

Mixing of the raw materials may be carried out either dry or wet.

When dry mixing, it suffices for instance to mix with a paint shaker, a ball mill or the like, using zirconia balls as a medium, as necessary drying, to obtain a raw materials mixture, which is not to limit the mixing method in particular.

When wet mixing, it suffices to bring the raw materials in a suspension state, and, using zirconia balls as a medium similarly to above, mix with a paint shaker, a ball mill or the like, then, separate the medium with a sieve or the like, and eliminate moisture from the suspension by a suitable drying method such as reduced pressure drying or vacuum drying to obtain a dry raw materials mixture.

Prior to firing, the raw materials mixture obtained as described above may be ground, sorted and dried, as necessary. However, there is no absolute need to perform grinding, sorting and drying.

For firing, firing at 1000° C. or higher is desirable.

In so doing, as firing atmosphere, a nitrogen gas atmosphere containing a small amount of hydrogen gas, a carbon dioxide atmosphere containing carbon monoxide, an atmosphere of hydrogen sulfide, carbon disulfide, other inert gases or reductive gases, and the like, can be adopted, among which firing with hydrogen sulfide atmosphere is desirable.

If the firing temperature is 1000° C. or higher, sufficient and uniform firing can be carried out.

Although the upper limit of the firing temperature is determined by the endurable temperature of the firing oven, the decomposition temperature of the product, and the like, firing at 1000 to 1200° C. is particularly desirable in the fabrication method of the present green emitting phosphor. In addition, although the firing time is related to the firing temperature, it is on the order of 2 to 24 hours.

In the above-mentioned firing, when the raw materials mixture does not contain sulfur raw materials, firing in an atmosphere of hydrogen sulfide or carbon disulfide is desirable. However, when sulfur raw materials are contained in the raw materials mixture, firing is possible in an atmosphere of hydrogen sulfide, carbon disulfide or inert gas. In this case, hydrogen sulfide and carbon disulfide are sometimes turned into sulfur compounds and also have the function of suppressing decomposition of the products.

Meanwhile, when using hydrogen sulfide or carbon disulfide for the firing atmosphere, since these compounds are also turned into sulfur compounds, when, for instance, BaS is used as a raw material constituent, it is equivalent to using a barium compound and a sulfur compound.

In the fabrication of the present green emitting phosphor, it is necessary after firing to crush with a stamp mill, an automatic mortar grinder, a paint shaker and the like, and then sort with a sieve or the like. When crushing, it is desirable to adjust the crushing time so that the particle size does not become excessively fine.

In addition, in the sorting with a sieve or the like, it is desirable to sort so as to cut particle sizes larger than 150 μm, particularly particle sizes larger than 130 μm, and particularly among them, particle sizes larger than 110 μm. In addition, it is desirable to sort so as to cut particle sizes smaller than 2 μm, particularly particle sizes smaller than 3 μm, and particularly among them, particle sizes smaller than 4 μm.

Furthermore, introducing the raw materials into a non-aqueous organic solvent, ethanol to begin with, water or the like, stirring while applying ultrasonic vibrations, then, letting the solution to stand still, eliminating the supernatant and recovering the precipitate, followed by drying, is desirable. This last solvent precipitation and sorting treatment allows the external quantum efficiency to be increased remarkably.

(Applications)

By combination with an excitation source, the present green emitting phosphor can constitute a light luminescent device or unit, and can be used in various applications. It can be used, for instance, in addition to general lighting, in special light sources, backlights for liquid crystals, display devices such as display devices for EL, FED and CRT.

As one example of green light luminescent device or unit combining the present green emitting phosphor and an excitation source that may excite this, a green light luminescent device or unit can be cited, constituted for instance by placing the present green emitting phosphor in the vicinity of a light emitting body generating light at 300 nm to 510 nm wavelength (that is to say, violet light to blue light), that is to say, a position where the light emitted by the light emitting body may be received. Concretely, it suffices to layer a phosphor layer comprising the present green emitting phosphor over a light emitting body layer comprising a light emitting body.

In so doing, for the phosphor layer, it suffices to add, for instance, the present green emitting phosphor in powder form along with a bonding agent to a suitable solvent, mix thoroughly to disperse the powder homogeneously to turn the mixture into a coating solution, coat the obtained coating solution on the surface of the light emitting layer and dry to form a coat film (phosphor layer).

In addition, it is also possible to form the phosphor layer by kneading the present green emitting phosphor in a glass composition or a resin composition to disperse the present green emitting phosphor within a glass layer or within a resin layer.

Furthermore, the present green emitting phosphor may be formed into a sheet, and this sheet may be layered over a light emitting body layer, and in addition, the present green emitting phosphor may be sputtered directly over a light emitting body layer to form a film.

Furthermore, the present green emitting phosphor, a red emitting phosphor, as necessary a blue emitting phosphor, and an excitation source that may excite these can be combined to constitute a white light luminescent device or unit. Such a white light luminescent device or unit can be used, for instance, in addition to general lighting, in special light sources, backlights for liquid crystals, display devices such as display devices for EL, FED and CRT.

As one example of white light emitting element or device constituted by combining the present green emitting phosphor, a red emitting phosphor, as necessary a blue emitting phosphor, and an excitation source that may excite these, a white light emitting element or device can be cited, constituted for instance by placing the present green emitting phosphor, along with placing a red emitting phosphor and as necessary a blue emitting phosphor, in the vicinity of a light emitting body generating light at 300 nm to 510 nm wavelength (that is to say, violet light to blue light), that is to say, a position where the light emitted by the light emitting body may be received. Concretely, it suffices to layer a phosphor layer comprising the present green emitting phosphor, a phosphor layer comprising a red emitting phosphor, and as necessary a phosphor layer comprising a blue emitting phosphor, over a light emitting body layer comprising a light emitting body.

In addition, for instance, the present green emitting phosphor, a red emitting phosphor and, as necessary, a blue emitting phosphor, in powder form along with a bonding agent may be added to a suitable solvent, mixed thoroughly to disperse the powders homogeneously, the obtained coating solution coated on the surface of the light emitting layer and dried to form a coat film (phosphor layer).

Furthermore, it is also possible to form the phosphor layer by kneading the present green emitting phosphor, a red emitting phosphor and, as necessary, a blue emitting phosphor in a glass composition or a resin composition to disperse the phosphors within a glass layer or within a resin layer.

In addition, a phosphor layer comprising the present green emitting phosphor and a red emitting phosphor kneaded in a resin may be formed over an excitation source comprising a blue LED or a near-ultraviolet LED.

Furthermore, the present green emitting phosphor, a red emitting phosphor and, as necessary, a blue emitting phosphor may each be formed into a sheet, and this sheet be layered over a light emitting body layer, and in addition, the present green emitting phosphor and a red emitting phosphor may be sputtered directly over a light emitting body layer to form a film.

(Explanation of Terms)

In the present invention, "light emitting element" in "green light luminescent device or unit" or "white light luminescent device or unit" means a light emitting device provided with at least an emitting phosphor and a light emitting source as an excitation source therefor, which emits light at a relatively small scale, and "light emitting unit" means a light emitting device provided with at least an emitting phosphor and a light emitting source as an excitation source therefor, which emits light at a relatively large scale.

In the present invention, when "X to Y" (X and Y are any numbers) is stated, it includes the meaning of "X or greater but Y or less" along with the meaning of "preferably greater than X" or "preferably less than Y", unless expressly indicated otherwise.

In addition, when "X or greater" (X is any number) or "Y or less" (Y is any number) is stated, it includes the meaning to the effect of "greater than X is desirable" or "less than Y is desirable".

EXAMPLES

Hereinafter, the present invention will be described based on examples. However, the present invention is not to be interpreted limited by these.

<Particle Size Volume-Based Distribution Measurement using a Laser Diffraction Particle Size Distribution Analyzer>

The interior of the circulation system was filled with a solution of 99.5% ethanol, and without performing dispersion treatment such as ultrasound dispersion (the ultrasound of the apparatus was set to OFF), using a laser diffraction particle size distribution analyzer ("LA-920", manufactured by Horiba, Ltd.), powder samples were introduced so as to have 90 to 85% transmittance, and particle size was measured while circulating the particles in the solvent inside the measurement cell.

D5, D10, D50, D90, and the like, were determined from the particle size volume-based distribution figure (chart) obtained by this measurement.

Note that the relative refractive index against solvent was set to 1.20, and the circulation speed was set to 3.

<Measurement of the Specific Surface Area>

The specific surface area (SSA) was measured with "Flow Sorb II 2300" manufactured by Shimadzu, by the BET1 point method.

<Measurement of PL Emission Spectrum>

PL (photo-luminescence) spectra were measured using a spectrofluorimeter (F-4500, manufactured by Hitachi).

<Measurement of CIE Color Coordinates>

The brightness and the light emission color (xy values of the CIE color coordinates) were determined from the PL emission spectra using the following formula:

[Math. 1]

Method for converting CIE (Commission Internationale de l'Eclairage) chromaticity coordinate values.

If the light emission waveform of the sample is P(λ)

$$\left. \begin{array}{l} X = K \int_{380}^{780} P(\lambda)\bar{x}(\lambda)d\lambda \\ Y = K \int_{380}^{780} P(\lambda)\bar{y}(\lambda)d\lambda \\ Z = K \int_{380}^{780} P(\lambda)\bar{z}(\lambda)d\lambda \end{array} \right\} \quad (1)$$

where, $$K = \frac{1}{K \int_{380}^{780} P(\lambda)\bar{y}(\lambda)d\lambda}$$

The chromaticity coordinate values x and y are calculated from (1)

$$x = \frac{X}{X+Y+Z}$$
$$y = \frac{Y}{X+Y+Z}$$ (2)

However, x bar (λ), y bar (λ) and z bar (λ) are CIE spectral tristimulus values at 2° or 10° field of view, and the spectral tristimulus values at 2° field of view was used in the present specification.

<Measurements of Absorption Ratio, Internal Quantum Efficiency and External Quantum Efficiency>

Performed using the spectrofluorimeter FP-6500 and the integrating sphere unit ISF-513 (manufacture by JASCO Corporation), and according to a solid-state quantum efficiency calculation program. Note that the spectrofluorimeter was corrected using a secondary reference light source and rhodamine B.

The equations for the calculation of the absorption ratio, the internal quantum efficiency and the external quantum efficiency of the SrGa$_2$S$_4$:Eu phosphor when the excitation light was 466 nm are shown below:

[Math. 2]

Let P$_1$(λ) be the spectrum of a reference whiteboard, P$_2$(λ) the spectrum of a sample and P$_3$(λ) the spectrum of an indirectly excited sample. Let the surface L$_1$ comprising the spectrum P$_i$(λ) enclosed by the range of excitatil on wavelength 451 nm-481 nm be the intensity of excitation.

$$L_1 = \int_{451}^{481} P_1(\lambda)d\lambda$$

Let the surface L$_2$ comprising the spectrum P$_2$(λ) enclosed by the range of excitation wavelength 451 nm-481 nm be the diffusion intensity of the sample.

$$L_2 = \int_{451}^{481} P_2(\lambda)d\lambda$$

Let the surface E$_2$ comprising the spectrum P$_2$(λ) enclosed by the range of excitation wavelength 482 nm-648.5 nm be the fluorescence intensity of the sample.

$$E_2 = \int_{482}^{648.5} P_2(\lambda)d\lambda$$

Let the surface L$_3$ comprising the spectrum P$_3$(λ) enclosed by the range of excitation wavelength 451 nm-481 nm be the intensity of indirect diffusion.

$$L_3 = \int_{451}^{481} P_3(\lambda)d\lambda$$

Let the surface E$_3$ comprising the spectrum P$_3$(λ) enclosed by the range of excitation wavelength 482 nm-648.5 nm be the intensity of indirect fluorescence.

$$E_3 = \int_{482}^{648.5} P_3(\lambda)d\lambda$$

The sample absorbance ratio is the ratio of the fraction of excitation light reduced by the sample over the incident light.

$$A = \frac{L_1 - L_2}{L_1}$$

The external quantum efficiency $\epsilon_{ex}$ is the number of photons N$_{em}$ of the fluorescent light emitted from the sample divided by the number of photons N$_{ex}$ of the excitation light shone on the sample.

$$N_{ex} = k \cdot L_1$$
$$N_{em} = k \cdot \left(E_2 - \frac{L_2}{L_3}E_3\right)$$
$$\therefore \varepsilon_{ex} = \frac{N_{em}}{N_{ex}} = \frac{E_2 - \frac{L_2}{L_1}E_3}{L_1}$$

The external quantum efficiency $\epsilon_{in}$ is the number of photons N$_{em}$ of the fluorescent light emitted from the sample divided by the number of photons N$_{abs}$ of the excitation light absorbed by the sample.

$$N_{ex} = k \cdot (L_1 - L_2)$$
$$N_{em} = k \cdot E_2$$
$$\therefore \varepsilon_{ex} = \frac{N_{em}}{N_{abs}} = \frac{E_2 - \frac{L_2}{L_1}E_3}{L_1 - L_2}$$

(from JASCO FWSQ-6-17(32) Solid-state Quantum Efficiency Calculation Program manual)

Test 1

Using SrS, Ga$_2$S$_3$ and EuS as starting raw materials, SrS and Ga$_2$S$_3$ were mixed so that the atomic ratio Sr/S was 1 and EuS was mixed so as to have 1.0 mol % with respect to Sr, which were mixed using a ∅3 mm zirconia ball as a medium, and the obtained mixture was fired in a hydrogen sulfide atmosphere at 1000° C. for 6 hours. Next, the obtained fired material was crushed, and using sieves with 140 mesh and 440 mesh openings, the materials under the sieve with 140 mesh opening and above the sieve with 440 mesh opening were recovered to obtain samples by recovering the powders.

In so doing, the apparatus and time used for mixing and the apparatus and time used for crushing were changed to obtain samples with various particle sizes.

In addition, for a portion of the samples, the powders recovered in this way were introduced in a 99.5% ethanol solution (25° C.), dispersed by applying ultrasound ("W-113" manufactured by Honda Electronics) while stirring, and after the solution was left to stand, only the precipitated material was recovered, excluding the supernatant, and dried with a dryer (100° C.) for 10 minutes to obtain samples (Samples 1-41).

For the Samples 1-41 obtained in this way, a particle size volume-based distribution measurement was carried out to measure D5, D10, D50, D90, D95 and D99.9 for each, while the absorption ratio was measured for each (Table 1) and the relationship between the particle size (D5, D10, D50, D90, D95 and D99.9) and the absorption ratio plotted on a graph (FIG. 1). In addition, for each particle size, the plots were joined to determine the correlation coefficient, which was entered in the graph.

As a result, in a green emitting phosphor comprising at least the composition of the present green emitting phosphor, that is to say, a host material, which contains Ga, S and an element comprising one species or a combination of two or more species among Sr, Ba and Ca, and which has been doped with Eu as a luminescent center, even for samples obtained by different fabrication methods, it was found that in the relationship between the absorption ratio and D50, the correlation coefficient indicated $R^2<0.5$, while it indicated $R^2>0.9$ in the relationship with D5 and D10. That is to say, it could be found that, in the composition of the present green emitting phosphor, while prescribing D50, which indicates the median diameter, cannot improve the absorption ratio, prescribing D10 to D5 allowed the absorption ratio to be improved.

TABLE 1

| | Stratification None |
|---|---|
| N = 41 | Particle Size vs. Absorption Ratio Correlation Coefficient $R^2$ |
| D5 | 0.93 |
| D10 | 0.92 |
| D50 | 0.37 |
| D90 | 0.42 |
| D95 | 0.43 |
| D99.9 | 0.41 |

Examples 1 to 3 and Comparative Examples 1 to 2

Based on the observations obtained above, in order to have a more accurate insight into the relationship between the particle size distribution and absorption ratio, external quantum efficiency, CIE and the like, comparative tests were carried out for Example 1 group, 2 group, 3 group and Comparative Example group, which were separated into groups based on the particle size distribution.

Note that, Example 1 group, 2 group, 3 group and Comparative Example group comprise the phosphor powders obtained by various fabrication methods which were separated into groups based on particle size distribution, as shown in the following Table 2.

TABLE 2

| | | Particle size | | | | | Relative surface area |
|---|---|---|---|---|---|---|---|
| | | D5 (μm) | D10 (μm) | D50 (μm) | D90 (μm) | P10/p50 | |
| Comparative Example group | Absorption ratio 65% or lower | 3.5 or smaller 40 or larger | 4.5 or smaller 100 or larger | 7 or smaller 160 or larger | 8 or smaller 190 or larger | 0.2 or smaller 0.7 or larger | 0.15 or smaller 1.9 or larger |
| Example 1 group | Absorption ratio 65% to 70% | 3.5 or larger 25 or smaller | 4.5 or larger 30 or smaller | 7 or larger 50 or smaller | 7.5 or larger 100 or smaller | 0.2 or larger 0.65 or smaller | 0.2 or larger 1.2 or smaller |
| Example 2 group | Absorption ratio 70% to 75% | 4.5 or larger 25 or smaller | 5 or larger 30 or smaller | 8 or larger 50 or smaller | 13 or larger 100 or smaller | 0.2 or larger 0.6 or smaller | 0.2 or larger 0.9 or smaller |
| Example 3 group | Absorption ratio 75% or higher | 5 or larger 25 or smaller | 7 or larger 30 or smaller | 12 or larger 50 or smaller | 22 or larger 100 or smaller | 0.2 or larger 0.55 or smaller | 0.2 or larger 0.6 or smaller |

(Fabrication Method for Example and Comparative Example)

Using SrS, Ga$_2$S$_3$ and EuS as starting raw materials, SrS and Ga$_2$S$_3$ were mixed so that the atomic ratio Sr/S was 1 and EuS was mixed so as to have 1.0 mol % with respect to Sr, which were mixed for 100 minutes with a paint shaker using a ⌀3 mm zirconia ball as a medium, and the obtained mixture was fired in a hydrogen sulfide atmosphere at 900° C. to 1000° C. for one hour to 24 hours (firing was carried out in multiple stages depending on the Example).

Next, after crushing with an automatic mortar grinder ("ALM-360T" manufactured by Nitto Kagaku Co.) for 0.5 minutes to 25 minutes or crushing with a paint shaker (paint shaker "100V", manufactured by Asada Iron Works Co., Ltd.) for 10 minutes to 30 minutes, sieves with 140 mesh and 440 mesh openings were used to recover the materials under the sieve with 140 mesh opening and above the sieve with 440 mesh opening and obtain a phosphor powder comprising a crystal represented by the general formula SrGa$_2$S$_4$:Eu$^{2+}$.

In addition, depending on the Example, fractionation treatment by ethanol precipitation, such as the following one, was further carried.

That is to say, the powder recovered by sieve separation as described above was further introduced in a 99.5% ethanol solution (25° C.), depending on the Example, dispersed by applying ultrasound ("W-113" manufactured by Honda Electronics) successively at 28 Hz, 45 Hz and 100 Hz over one minute to two minutes, and the solution was left to stand for 30 seconds to 10 minutes (this time is the ethanol precipitation time indicated in Table 3). Then, only the precipitated material was recovered, excluding the supernatant, and dried with a dryer (100° C.) for 10 minutes to obtain a phosphor powder represented by the general formula SrGa$_2$S$_4$:Eu$^{2+}$.

Note that, regarding the firing condition, the grinding condition and the fractionation condition for each Example and Comparative Example, Table 3 should be referred to.

The results of measurement of various physical properties of the phosphor powder obtained in each Example and Comparative Example, that is to say, the results of measurement of the particle size, the ratio (p10/p50) of the frequency at 10% cumulative percent passing with respect to the frequency at 50% cumulative percent passing, the specific surface area, the absorption ratio, the external quantum efficiency and the CIE color coordinates are shown in Table 4.

TABLE 3

| | Fabrication conditions | | |
|---|---|---|---|
| | Firing | Grinding | Fractionation |
| Comparative Example 1 | 900° C. 6 h | Auto mortar grinder 25 min | Sieve (140 mesh) |
| Comparative Example 2 | 1000° C. 24 h | Auto mortar grinder 5 min | Sieve (140 mesh) above net |
| Example 1-1 | 1000° C. 6 h | PS 30 min | Sieve (140 mesh) → Ethanol precip. 10 min |
| Example 1-2 | 1000° C. 6 h | Auto mortar grinder 15 min | Sieve (140 mesh) |
| Example 1-3 | 1000° C. 10 h | Auto mortar grinder 15 min | Sieve (140 mesh) |
| Example 1-4 | 1000° C. 6 h | Auto mortar grinder 13 min | Sieve (140 mesh) |
| Example 1-5 | 1000° C. 6 h | PS 10 min | Sieve (140 mesh) |
| Example 1-6 | 1000° C. 6 h | Auto mortar grinder 10 min | Sieve (140 mesh) |
| Example 1-7 | 1000° C. 3 h | Auto mortar grinder 10 min | Sieve (140 mesh) |
| Example 1-8 | 1000° C. 6 h | Auto mortar grinder 15 min | Sieve (140 mesh) → Ethanol precip. 10 min |
| Example 1-9 | Ca and Ba 5 mol % each to Sr 1000° C. 6 h | Auto mortar grinder 5 min | Sieve (140 mesh) |
| Example 2-1 | 1050° C. 4 h | Auto mortar grinder 8 min | Sieve (140 mesh) |
| Example 2-2 | 1000° C. 10 h | Auto mortar grinder 8 min | Sieve (140 mesh) |
| Example 2-3 | 1050° C. 6 h | Auto mortar grinder 8 min | Sieve (140 mesh) |
| Example 2-4 | 1000° C. 10 h → 1000° C. 2 h | Auto mortar grinder 8 min | Sieve (140 mesh) |
| Example 2-5 | 1000° C. 6 h | Auto mortar grinder 10 min | Sieve (140 mesh) → Ethanol precip. 10 min |
| Example 2-6 | 1000° C. 10 h | Auto mortar grinder 8 min | Sieve (140 mesh) → Ethanol ultrasound dispersion 1 min, precip. 10 min |
| Example 2-7 | 1100° C. 5 h | Auto mortar grinder 8 min | Sieve (140 mesh) |
| Example 2-8 | 1000° C. 10 h | Auto mortar grinder 8 min | Sieve (140 mesh) → Ethanol precip. 5 min |
| Example 2-9 | 1100° C. 10 h | Auto mortar grinder 10 min | Sieve (140 mesh) |
| Example 2-10 | 1000° C. 10 h | Auto mortar grinder 8 min | Sieve (140 mesh) → Ethanol ultrasound dispersion 2 min, precip. 5 min |
| Example 2-11 | 1100° C. 10 h→1000° C. 2 h | Auto mortar grinder 8 min | Sieve (140 mesh) |
| Example 2-12 | 1000° C. 10 h | Auto mortar grinder 8 min | Sieve (140 mesh) → Ethanol precip. 3 min |
| Example 2-13 | 1000° C. 10 h | Auto mortar grinder 1 min | Sieve (140 mesh) |
| Example 2-14 | 1000° C. 10 h | Auto mortar grinder 8 min | Sieve (140 mesh) → Ethanol precip. 1 min |
| Example 3-1 | 1000° C. 10 h→1000° C. 12 h (Ar atmosphere) | Auto mortar grinder 8 min | Sieve (140 mesh) |
| Example 3-2 | 1000° C. 30 h | Auto mortar grinder 8 min | Sieve (140 mesh) |
| Example 3-3 | 1000° C. 10 h→500° C. 2 h | Auto mortar grinder 8 min | Sieve (140 mesh) |
| Example 3-4 | 900° C. 1 h→1000° C. 5 h→ 1100° C. 5 h | Auto mortar grinder 8 min | Sieve (140 mesh) |
| Example 3-5 | 1000° C. 10 h | Auto mortar grinder 0.5 min | Sieve (140 mesh) |
| Example 3-6 | 1000° C. 10 h | Auto mortar grinder 8 min | Sieve (140 mesh) → Ethanol precip. 1 min (×2) |
| Example 3-7 | 1000° C. 24 h | Auto mortar grinder 8 min | Sieve (140 mesh) → Ethanol precip. 1 min (×3) |
| Example 3-8 | 1000° C. 24 h | Auto mortar grinder 5 min | Sieve (140 mesh) |
| Example 3-9 | 1000° C. 24 h | Auto mortar grinder 1 min | Sieve (140 mesh) → Water precip. 10 min |
| Example 3-10 | 1000° C. 24 h | Auto mortar grinder 5 min | Sieve (140 mesh) → Ethanol precip. 30 sec |
| Example 3-11 | 1000° C. 10 h | Auto mortar grinder 1 min | Sieve (140 mesh) |
| Example 3-12 | 1000° C. 10 h | Auto mortar grinder 8 min | Sieve (140 mesh) → Sieve (440 mesh) above net |

TABLE 4

| | Particle size (μm) | | | | | Relative surface area (m2/g) | Absorption ratio (%) | External quantum efficiency (%) | CIE | |
|---|---|---|---|---|---|---|---|---|---|---|
| | D5 | D10 | D50 | D90 | P10/p50 | | | | X | y |
| Comparative Example 1 | 2.45 | 3.64 | 6.99 | 7.48 | 0.20 | 1.85 | 62.8 | 32.7 | 0.295 | 0.672 |
| Comparative Example 2 | 46.3 | 106.6 | 170.4 | 201.6 | 0.70 | 0.15 | 62.6 | 36.8 | 0.294 | 0.673 |
| Example 1-1 | 3.95 | 5.09 | 10.6 | 28.1 | 0.33 | 1.17 | 67.2 | 35.6 | 0.296 | 0.674 |
| Example 1-2 | 4.17 | 4.73 | 7.41 | 10.1 | 0.24 | 0.98 | 68.6 | 37.5 | 0.293 | 0.675 |
| Example 1-3 | 4.63 | 5.33 | 8.52 | 13.4 | 0.22 | 0.46 | 68.7 | 41.3 | 0.295 | 0.677 |
| Example 1-4 | 4.66 | 5.35 | 8.54 | 13.7 | 0.22 | 1.06 | 68.7 | 36.7 | 0.293 | 0.673 |
| Example 1-5 | 5.18 | 5.93 | 8.89 | 13.7 | 0.24 | 0.50 | 69.0 | 42.7 | 0.293 | 0.673 |
| Example 1-6 | 6.16 | 7.07 | 11.1 | 19.2 | 0.65 | 0.78 | 69.6 | 46.3 | 0.295 | 0.673 |
| Example 1-7 | 5.44 | 6.18 | 7.20 | 7.94 | 0.36 | 0.88 | 69.6 | 38.2 | 0.294 | 0.673 |
| Example 1-8 | 4.84 | 5.85 | 10.3 | 18.5 | 0.32 | 0.93 | 69.7 | 40.6 | 0.294 | 0.672 |
| Example 1-9 | 4.24 | 4.92 | 7.95 | 11.2 | 0.55 | 0.98 | 68.6 | 37.5 | 0.278 | 0.640 |
| Example 2-1 | 5.00 | 5.73 | 8.80 | 14.0 | 0.28 | 0.87 | 70.1 | 40.2 | 0.295 | 0.673 |
| Example 2-2 | 5.94 | 6.83 | 10.7 | 18.7 | 0.62 | 0.58 | 70.9 | 42.4 | 0.294 | 0.673 |
| Example 2-3 | 6.08 | 6.85 | 9.64 | 14.5 | 0.46 | 0.53 | 71.4 | 43.9 | 0.296 | 0.673 |
| Example 2-4 | 6.24 | 7.27 | 12.4 | 26.5 | 0.36 | 0.45 | 71.8 | 48.1 | 0.295 | 0.672 |
| Example 2-5 | 5.92 | 6.80 | 10.4 | 16.9 | 0.31 | 0.32 | 72.1 | 47.3 | 0.295 | 0.673 |
| Example 2-6 | 6.49 | 7.55 | 12.6 | 24.6 | 0.44 | 0.49 | 72.8 | 43.1 | 0.296 | 0.672 |

TABLE 4-continued

|  | Particle size (μm) | | | | | Relative surface area (m2/g) | Absorption ratio (%) | External quantum efficiency (%) | CIE | |
| --- | --- | --- | --- | --- | --- | --- | --- | --- | --- | --- |
|  | D5 | D10 | D50 | D90 | P10/p50 | | | | X | y |
| Example 2-7 | 7.07 | 8.00 | 13.2 | 27.9 | 0.35 | 0.40 | 72.8 | 47.5 | 0.295 | 0.672 |
| Example 2-8 | 6.94 | 7.87 | 12.5 | 22.0 | 0.36 | 0.40 | 73.6 | 45.3 | 0.296 | 0.673 |
| Example 2-9 | 7.58 | 8.36 | 13.5 | 24.3 | 0.60 | 0.30 | 74.0 | 46.1 | 0.296 | 0.673 |
| Example 2-10 | 7.75 | 8.51 | 13.5 | 22.4 | 0.55 | 0.32 | 74.1 | 46.5 | 0.295 | 0.674 |
| Example 2-11 | 4.63 | 5.33 | 8.52 | 13.4 | 0.34 | 0.48 | 74.2 | 44.8 | 0.296 | 0.673 |
| Example 2-12 | 7.46 | 8.31 | 13.6 | 25.3 | 0.61 | 0.38 | 74.3 | 45.9 | 0.295 | 0.674 |
| Example 2-13 | 7.52 | 8.35 | 13.7 | 25.8 | 0.61 | 0.36 | 74.4 | 46.4 | 0.295 | 0.673 |
| Example 2-14 | 7.83 | 8.72 | 14.3 | 27.8 | 0.49 | 0.34 | 74.6 | 46.4 | 0.295 | 0.673 |
| Example 3-1 | 7.98 | 8.94 | 14.5 | 26.4 | 0.42 | 0.36 | 75.2 | 47.1 | 0.295 | 0.672 |
| Example 3-2 | 6.26 | 7.30 | 12.3 | 25.7 | 0.45 | 0.45 | 75.5 | 45.1 | 0.295 | 0.672 |
| Example 3-3 | 5.94 | 6.99 | 12.5 | 39.0 | 0.37 | 0.48 | 75.9 | 42.6 | 0.295 | 0.673 |
| Example 3-4 | 8.12 | 9.09 | 14.4 | 22.4 | 0.36 | 0.46 | 76.5 | 47.5 | 0.206 | 0.674 |
| Example 3-5 | 9.00 | 10.2 | 16.6 | 31.0 | 0.34 | 0.31 | 76.7 | 46.2 | 0.295 | 0.674 |
| Example 3-6 | 8.87 | 10.1 | 16.3 | 32.9 | 0.37 | 0.30 | 77.2 | 45.0 | 0.295 | 0.673 |
| Example 3-7 | 9.09 | 10.3 | 16.0 | 26.3 | 0.34 | 0.30 | 77.2 | 46.3 | 0.295 | 0.672 |
| Example 3-8 | 8.46 | 9.64 | 16.0 | 28.8 | 0.45 | 0.43 | 77.4 | 45.5 | 0.295 | 0.673 |
| Example 3-9 | 10.0 | 11.4 | 18.5 | 40.0 | 0.40 | 0.29 | 79.0 | 46.6 | 0.296 | 0.673 |
| Example 3-10 | 11.3 | 13.3 | 22.7 | 61.5 | 0.40 | 0.35 | 79.4 | 47.0 | 0.295 | 0.673 |
| Example 3-11 | 6.63 | 7.73 | 13.4 | 29.4 | 0.37 | 0.53 | 79.8 | 42.8 | 0.296 | 0.674 |
| Example 3-12 | 15.4 | 21.5 | 48.4 | 86.7 | 0.24 | 0.50 | 80.5 | 56.9 | 0.295 | 0.673 |

(Discussion)

As a result, it was confirmed from the excitation spectrum (FIG. 2 (B)) that the present green emitting phosphor (Sample 1) was sufficiently excited by a light of 300 nm to 510 nm wavelength (that is to say, violet light to blue light), and particularly from the fact that two peaks were observed, that it was more sufficiently excited by near-ultraviolet light and blue light.

In addition, as a result of tests not shown in the present specification, it was observed that the position of the emission peak could be adjusted within the range of 502 nm±30 nm to 557 nm±30 nm wavelength by altering the proportions of Sr, Ba and Ca, and in addition, the green color tone could be adjusted within the range of x=0.05 to 0.40, y=0.50 to 0.80 CIE color coordinates by altering the proportions of Sr, Ba and Ca, in which case, it was observed that the width and the position of the emission spectrum did not change even if the present green emitting phosphor is excited with any wavelength in the near-ultraviolet region to blue region (on the order of 300 nm to 510 nm) wavelength, if the composition is identical.

From the point of view of raising the absorption ratio of the phosphor particle to 65% or greater, raising preferably to 70% or greater, and raising more preferably to 75% or greater, 4.5 μm to 30 μm was required regarding D10, preferably 5 μm to 30 μm and more preferably 7 μm to 30 μm. In addition, 3.5 μm to 20 μm was desirable regarding D5, in particular 4.5 μm to 20 μm, of which in particular 5 μm to 20 μm was desirable. It was observed regarding D90 that 7.5 μm or larger, in particular 13 μm or larger, of which in particular 22 μm or larger was desirable, and in addition, 190 μm or smaller, of which 100 μm or smaller, of which in particular 50 μm or smaller (in particular less than 50 μm) was particularly desirable.

In addition, similarly, from the point of view of raising the absorption ratio of the phosphor particle to 65% or greater, raising preferably to 70% or greater, and raising more preferably to 75% or greater, it was observed that 7 μm to 50 μm was desirable regarding D50, more preferably 8 μm to 50 μm, and particularly more preferably 12 μm to 50 μm.

Then, it was observed regarding the ratio (p10/p50) of the frequency at 10% cumulative percent passing (%, noted p10) with respect to the frequency at 50% cumulative percent passing (%, noted p50), that 0.20 to 0.65 was desirable, in particular 0.20 to 0.60, of which in particular 0.20 to 0.55 was desirable.

Here, "frequency" means the frequency (%) of the corresponding particle size in the case of 128 ch in the range of 0.1 μm to 1000 μm.

In addition, it could be observed that when fractionation treatment by ethanol precipitation (washing with ethanol and fractionation by precipitation) was performed, absorption ratio and external quantum efficiency improved remarkably.

However, as a result of performing similar treatment on CaS:Eu and SrS:Eu, no effect of remarkable improvement on the external quantum efficiency was observed.

Examples 4 to 8 and Comparative Example 3

SrS, $Ga_2S_3$ and EuS were used as starting materials, and except that SrS and $Ga_2S_3$ were mixed in such a way that the atomic ratio Ga/Sr was set to the value indicated in Table 5, while the firing temperature was set to the temperature indicated in Table 5, up to firing and crushing was performed similarly to Example 2-10, to obtain a phosphor powder (sample) comprising a crystal represented by general formula $SrGa_2S_4:Eu^{2+}$.

In addition, thereafter, fractionation was further carried out, whereby sieves with 140 mesh and 440 mesh openings were used to recover the materials under the sieve with 140 mesh opening and above the sieve with 440 mesh opening and obtain a phosphor powder (sample) comprising a crystal represented by the general formula $SrGa_2S_4:Eu^{2+}$.

TABLE 5

| | Ga/Sr molar ratio | Firing temperature | Before, after fractionation | Fractionation yield (%) | Particle size (μm) | | | Absorption ratio (%) | External quantum efficiency (%) |
|---|---|---|---|---|---|---|---|---|---|
| | | | | | D10 | D50 | D90 | | |
| Comparative Example 3-1 | 2.00 | 1150° C. | Before | — | 6.58 | 13.41 | 51.96 | 71.46 | 43.27 |
| Example 4-1 | | | After | 71 | 12.06 | 24.06 | 66.03 | 77.45 | 44.30 |
| Example 5-1 | 2.21 | 1150° C. | Before | — | 6.67 | 28.24 | 84.29 | 68.81 | 50.91 |
| Example 5-2 | | | After | 86 | 12.19 | 35.76 | 94.40 | 77.56 | 59.60 |
| Example 6-1 | 2.45 | 1150° C. | Before | — | 6.87 | 26.58 | 74.08 | 70.58 | 51.89 |
| Example 6-2 | | | After | 91 | 12.76 | 41.46 | 100.56 | 77.83 | 60.95 |
| Example 7-1 | 2.72 | 1100° C. | Before | — | 6.32 | 23.55 | 69.31 | 69.38 | 49.95 |
| Example 7-2 | | | After | 90 | 13.53 | 42.69 | 106.77 | 77.37 | 58.99 |
| Example 8-1 | 3.02 | 1100° C. | Before | — | 6.18 | 24.33 | 79.82 | 68.68 | 50.10 |
| Example 8-2 | | | After | 89 | 11.41 | 38.61 | 98.85 | 75.83 | 57.61 |

Focusing on the pre-fractionation sample (post-firing), it was found that, with Ga/Sr>2.00, regardless of the fact that there was no large difference in the values of D10, the values of D50 became significantly larger value. That is to say, by having Ga/Sr>2.00, removal of fine grains causing the drop in absorption ratio is facilitated, allowing the fractionation yield to be improved, which allows industrial productivity to be increased dramatically.

Thus, from the point of view of such a fractionation yield it can be considered that, Ga/Sr is more preferably within the range of 2.2 to 3.0, in particular, even more preferably within the range of 2.4 to 2.7.

The invention claimed is:

1. A green emitting phosphor containing a crystal represented by $MGa_2S_4:Eu^{2+}$, wherein M is an element comprising one species or a combination of two or more species among Sr, Ba and Ca, and $Eu^{2+}$ is a luminescent center, and wherein the particle diameter at 10% (D10) cumulative percent passing from the small particle-size side is 4.5 μm to 30 μm in the volume-based particle size distribution measured and obtained by the laser diffraction/diffusion particle size distribution measurement method.

2. The green emitting phosphor according to claim 1, wherein the particle diameter at 90% (D90) cumulative percent passing from the small particle-size side being 100 μm or smaller in the volume-based particle size distribution measured and obtained by the laser diffraction/diffusion particle size distribution measurement method.

3. The green emitting phosphor according to claim 1, displaying an excitation spectrum of 300 nm to 510 nm wavelength.

4. The green emitting phosphor according to claim 2, displaying an excitation spectrum of 300 nm to 510 nm wavelength.

5. A green light luminescent device provided with an excitation source and the green emitting phosphor according to claim 1.

6. A green light luminescent device provided with an excitation source and the green emitting phosphor according to claim 2.

7. A green light luminescent device provided with an excitation source and the green emitting phosphor according to claim 3.

8. A green light luminescent device provided with an excitation source and the green emitting phosphor according to claim 4.

9. A green light luminescent unit provided with an excitation source and the green emitting phosphor according to claim 1.

10. A green light luminescent unit provided with an excitation source and the green emitting phosphor according to claim 2.

11. A green light luminescent unit provided with an excitation source and the green emitting phosphor according to claim 3.

12. A green light luminescent unit provided with an excitation source and the green emitting phosphor according to claim 4.

13. A white light luminescent device provided with an excitation source, the green emitting phosphor according to claim 1 and a red emitting phosphor.

14. A white light luminescent device provided with an excitation source, the green emitting phosphor according to claim 2 and a red emitting phosphor.

15. A white light luminescent device provided with an excitation source, the green emitting phosphor according to claim 3 and a red emitting phosphor.

16. A white light luminescent device provided with an excitation source, the green emitting phosphor according to claim 4 and a red emitting phosphor.

17. A white light luminescent unit provided with an excitation source, the green emitting phosphor according to claim 1 and a red emitting phosphor.

18. A white light luminescent unit provided with an excitation source, the green emitting phosphor according to claim 2 and a red emitting phosphor.

19. A white light luminescent unit provided with an excitation source, the green emitting phosphor according to claim 3 and a red emitting phosphor.

20. A white light luminescent unit provided with an excitation source, the green emitting phosphor according to claim 4 and a red emitting phosphor.

* * * * *

UNITED STATES PATENT AND TRADEMARK OFFICE
CERTIFICATE OF CORRECTION

| | | |
|---|---|---|
| PATENT NO. | : 8,282,859 B2 | Page 1 of 1 |
| APPLICATION NO. | : 13/057381 | |
| DATED | : October 9, 2012 | |
| INVENTOR(S) | : Jun-ichi Itoh et al. | |

It is certified that error appears in the above-identified patent and that said Letters Patent is hereby corrected as shown below:

ON THE TITLE PAGE:

Column 2, Item (57) Abstract, delete "D10, 4.5" and insert -- D10, is 4.5 --

Signed and Sealed this
Twenty-fifth Day of December, 2012

David J. Kappos
*Director of the United States Patent and Trademark Office*